United States Patent [19]

Noji et al.

[11] Patent Number: 5,266,823
[45] Date of Patent: Nov. 30, 1993

[54] SEMICONDUCTOR DEVICE HAVING FILM FOR CONTROLLING DIFFUSION OF IMPURITY

[75] Inventors: Hiroyuki Noji; Koichi Kishi; Yusuke Kohyama, all of Kawasaki; Soichi Sugiura, Yamato, all of Japan

[73] Assignee: Kabushiki Kaisha Toshiba, Kawasaki, Japan

[21] Appl. No.: 719,619

[22] Filed: Jun. 24, 1991

[30] Foreign Application Priority Data

Jun. 27, 1990 [JP] Japan ................................. 2-168931

[51] Int. Cl.⁵ ...................... H01L 27/01; H01L 29/10; H01L 27/02; H01L 29/06
[52] U.S. Cl. ..................................... 257/327; 257/344; 257/369; 257/408; 257/653
[58] Field of Search ............ 357/23.1, 23.3, 42, 357/54, 63, 20; 257/327, 344, 346, 369, 408, 607, 649, 653

[56] References Cited

U.S. PATENT DOCUMENTS

4,623,912 11/1986 Chang et al. ................. 357/23.15
4,937,645 6/1990 Ootsuka et al. ................. 357/23.3

Primary Examiner—Mark V. Prenty
Attorney, Agent, or Firm—Banner, Birch, McKie & Beckett

[57] ABSTRACT

According to this present invention, a semiconductor device includes source and drain diffusion layers, and a gate electrode formed on a substrate between the source diffusion layer and the drain diffusion layer. In addition, antioxidant films are respectively formed on the source diffusion layer and the drain diffusion layer. These antioxidant films are used for controlling a diffusion rate of an impurity contained in the source diffusion layer and the drain diffusion layer.

20 Claims, 6 Drawing Sheets

SEMICONDUCTOR DEVICE HAVING FILM FOR CONTROLLING DIFFUSION OF IMPURITY

BACKGROUND OF THE INVENTION

1. Field of the Invention

The present invention relates to a semiconductor device and a method for manufacturing the same and, more particularly, to shallowing of a source/drain diffusion layer.

2. Description of the Related Art

Conventional MOSFETs include an n-channel MOSFET using electrons as carriers and a p-channel MOSFET using holes as carriers.

A source/drain region of an n-channel MOSFET is formed by doping an n-type impurity such as arsenic in a p-type silicon substrate, a p-type well region, a p-type epitaxial layer, or the like. A source/drain diffusion layer of a p-channel MOSFET is formed by doping a p-type impurity such as boron in an n-type well region, an n-type epitaxial layer, an n-type silicon substrate, or the like.

Since a CMOS semiconductor device in which the n-and p-channel MOSFETs are formed on the same chip (the same substrate) has various advantages such as low power consumption, it is frequently used.

The CMOS semiconductor device has been rapidly developed in recent years. In addition to n- and p-channel elements, the CMOS semiconductor device is expected to be further micropatterned. Since arsenic has small diffusivity, so-called "extension" of a diffusion layer caused by a thermal hysteresis during manufacturing of the diffusion layer is small. Therefore, the n-channel MOSFET is easily micropatterned.

However, in the p-channel MOSFET, since the diffusivity of boron is large, a source/drain diffusion layer largely extends in a direction perpendicular to the substrate surface and a direction parallel thereto. When the diffusion layer expands as a whole, the impurity concentration of the diffusion layer is decreased. When the concentration of the diffusion layer is decreased, the sheet resistance of the diffusion layer is increased. More specifically, when the impurity concentration of the diffusion surface is decreased, the contact resistance between the diffusion layer and an internal wiring layer is decreased.

In addition, when the diffusion layer expands as a whole, a channel length is decreased as a result, and a so-called "short-channel effect" is easily caused. In order to avoid this, in the p-channel MOSFET, the gate length of a gate electrode must be set to be larger than that of the n-channel MOSFET. This disables micropatterning of the p-channel MOSFET.

Diffusion of boron or arsenic constituting a source/drain diffusion layer is performed by annealing the source/drain diffusion layer in an oxygen atmosphere. However, when boron is diffused by annealing the diffusion layer in the oxygen atmosphere, a diffusion rate of the boron is increased (Oxidation Enhanced Diffusion: to be referred to as an OED effect hereinafter).

SUMMARY OF THE INVENTION

It is an object of the present invention to provide a semiconductor device wherein when a diffusion layer contains an impurity which causes an OED effect, expansion of the diffusion layer is nevertheless prevented.

In order to solve the above problem, a semiconductor device of the present invention will be arranged as follows.

That is, an antioxidant film is further formed on a diffusion layer of a second conductivity type formed in a semiconductor substrate of a first conductivity type. When an impurity is diffused to form the diffusion layer of the second conductivity type, oxygen does not contaminate in the diffusion layer. Therefore, a diffusion rate of the impurity in the substrate is decreased, and the diffusion layer does not expand in the substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

A semiconductor device according to an embodiment of the present invention and a method for manufacturing the same will be described below with reference to the accompanying drawings. In all the drawings, the same reference numerals denote the same parts, thereby avoiding descriptive repetition.

FIGS. 1A to 1K are sectional views showing steps of manufacturing a CMOS semiconductor device according to the first embodiment of the present invention.

Figure 1A:
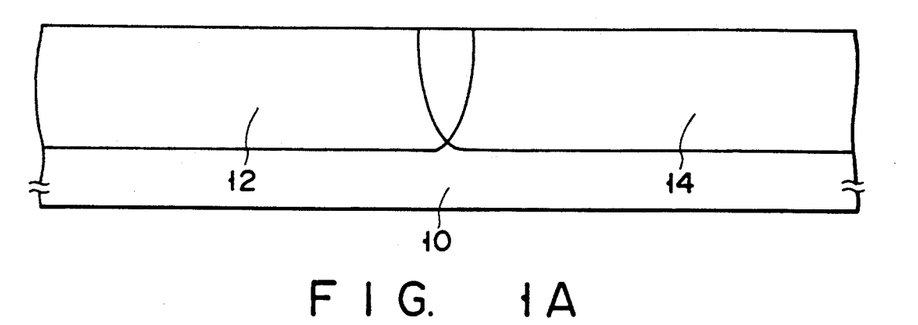
FIGS. 1A, 1B, 1C, 1D, 1E, 1F, 1G, 1H, 1I, 1J and 1K are sectional views showing the steps of manufacturing a CMOS semiconductor device according to the first embodiment of the present invention.

As shown in FIG. 1A, a p-type well region 12 having an impurity concentration of about $5 \times 10^{16}$ [cm$^{-3}$] and an n-type well region 14 having an impurity concentration of about $5 \times 10^{16}$ [cm$^{-3}$] are formed in a p-type silicon substrate 10 by a well-known well forming technique.

Figure 1B:
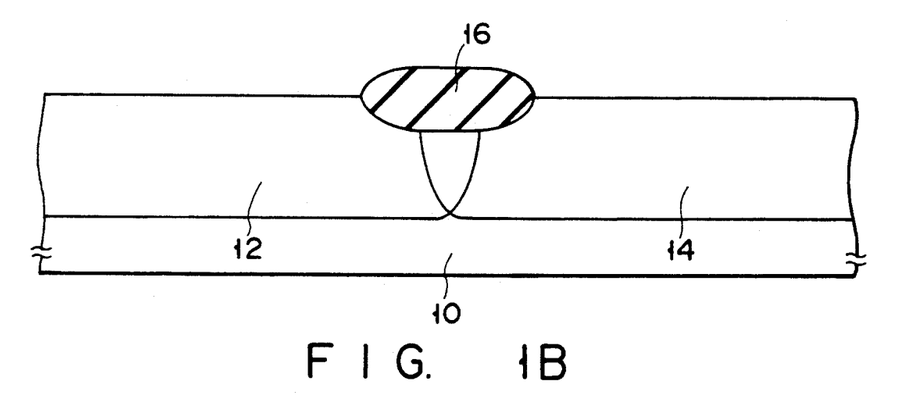

As shown in FIG. 1B, a field oxide film 16 prospectively serving as an element isolation region is formed on a surface region by a well-known selective oxidation method.

Figure 1C:
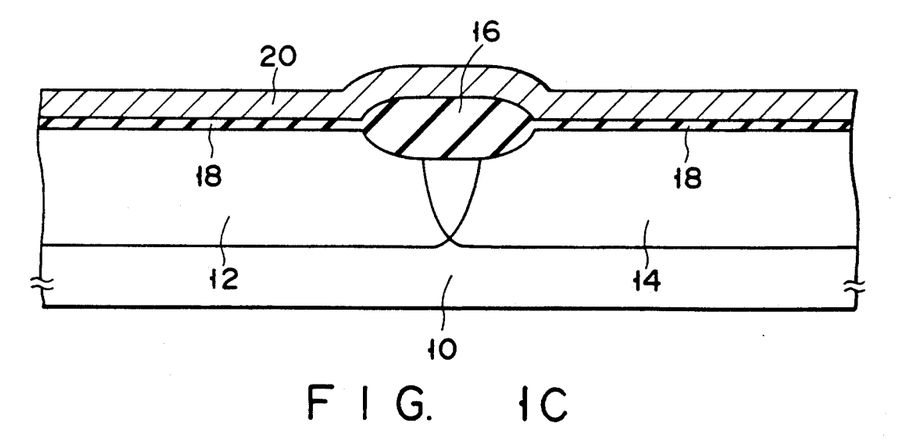

As shown in FIG. 1C, a thermal oxide film 18 is formed by, e.g., a thermal oxidation method, on an element region isolated by the field oxide film 16 to have a thickness of about 20 [nm]. A polysilicon film 20 is formed on the resultant structure by, e.g., a CVD method, to have a thickness of about 400 [nm].

Figure 1D:
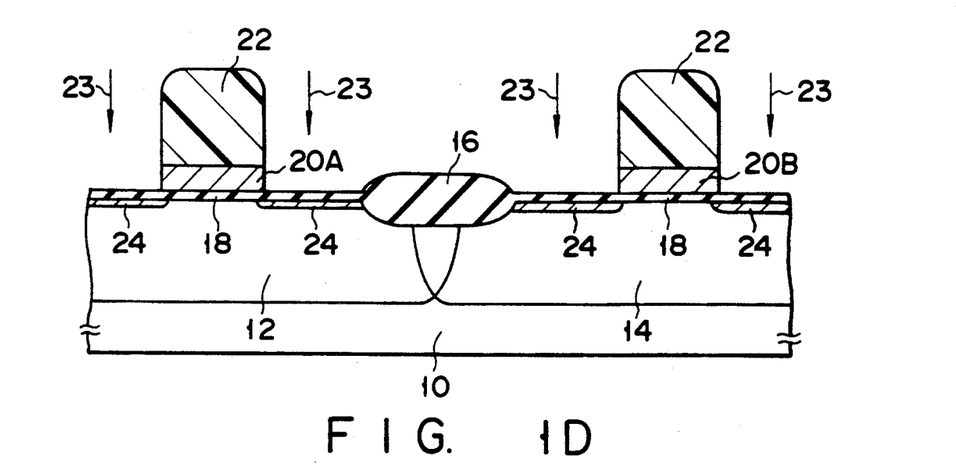

As shown in FIG. 1D, a photoresist is coated on the resultant structure to obtain a photoresist film. The photoresist film is patterned by photolithographic etching to obtain a photoresist pattern 22. The polysilicon film 20 is etched by, e.g., an RIE method, using the photoresist pattern 22 as a mask to obtain gate electrodes 20A and 20B. While the photoresist pattern 22 remains on the gate electrodes 20A and 20B, arsenic ions 23 are doped in the substrate 10 at a dose of $4 \times 10^{13}$ [cm$^{-2}$] using the photoresist pattern 22, the gate electrode 20A, and the gate electrode 20B as masks. The part in which the arsenic ions 23 are doped is represented by reference numeral 24 in FIG. 1D.

Figure 1E:
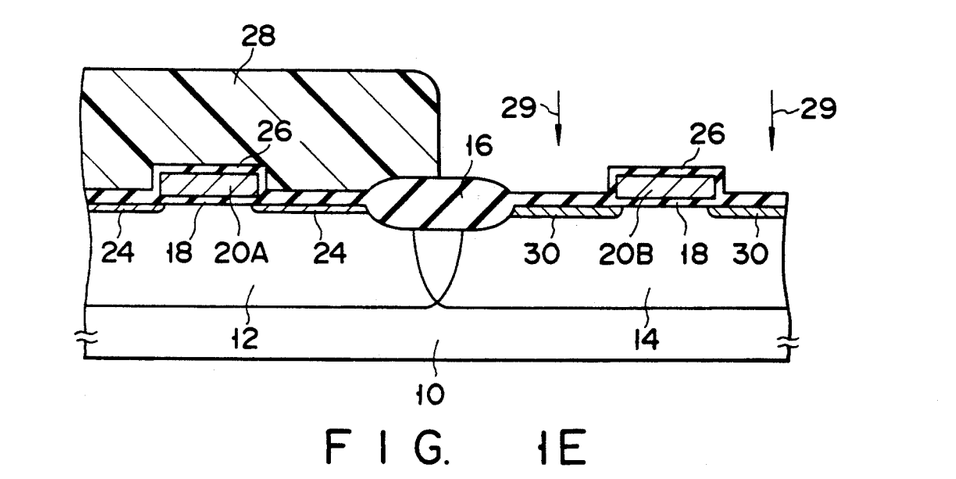

As shown in FIG. 1E, the photoresist pattern 22 is removed from the gate electrodes 20A and 20B. The surfaces of the gate electrodes 20A and 20B are thermally oxidized, thereby forming a thermal oxide film 26 having a thickness of about 20 [nm] on the surfaces of the gate electrodes 20A and 20B. A photoresist is coated on the resultant structure to obtain a photoresist layer. This photoresist layer is patterned by photolithographic etching to obtain a photoresist pattern 28. The photoresist pattern 28 is formed on the p-type well region 12 to cover the upper portion of the region 12. For example, boron fluoride (BF$_2$) ions are doped in an n-type well region 14 at a dose of $5 \times 10^{15}$ [cm$^{-2}$] using the photoresist pattern 28, the gate electrode 28B, and the like as masks. The portion in which the boron ions are doped is represented by reference numeral 30.

Figure 1F:
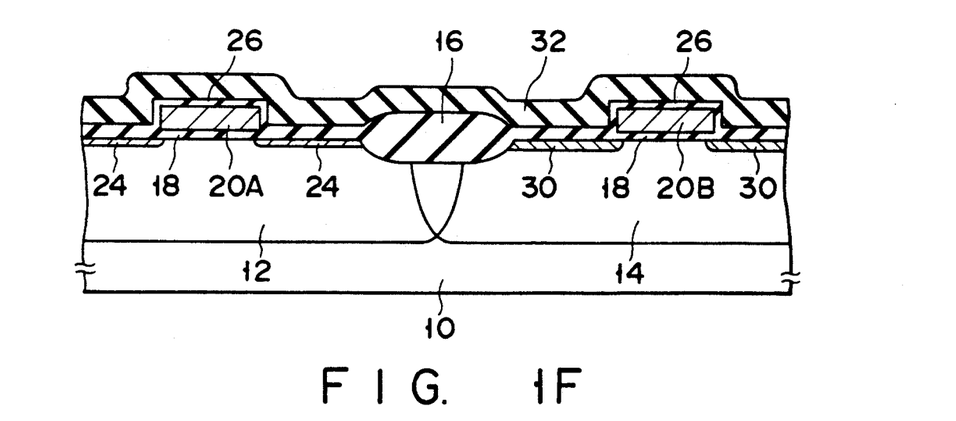

As shown in FIG. 1F, the photoresist pattern 28 is removed from the p-type well region 12. A CVD silicon oxide film 32 is formed on the resultant structure by a CVD method.

Figure 1G:
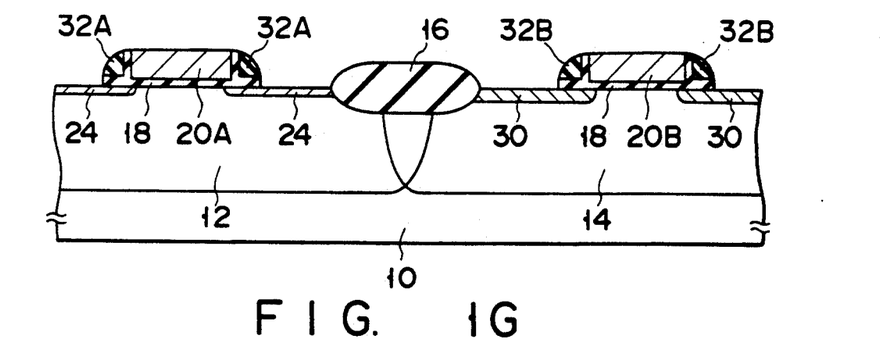

As shown in FIG. 1G, the photoresist pattern 28 is removed from the p-type well region 12. The CVD oxide film 32 is etched by an RIE method serving as anisotropic etching, thereby respectively forming side walls 32A and 32B on the side surfaces of the gate electrodes 20A and 20B. Note that, during the etching, the surface of the silicon substrate 10 is preferably exposed at least the portion 30 in which boron ions are doped.

Figure 1H:
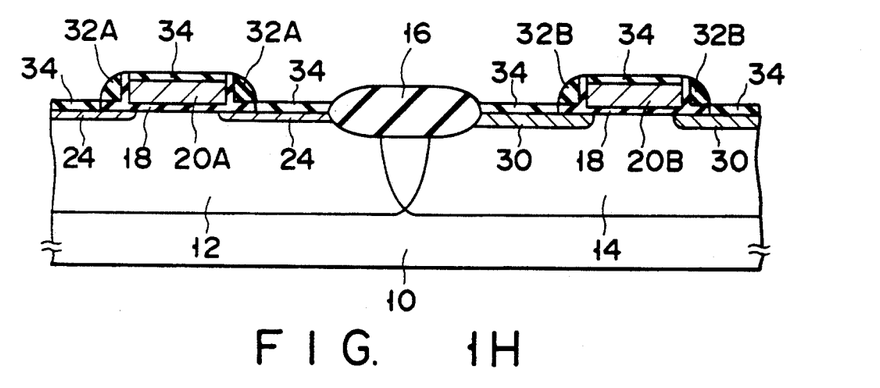

As shown in FIG. 1H, the exposed portion of the silicon substrate 10 is nitrified by, e.g., thermal nitrification, thereby forming a silicon nitride film 34 having a thickness of about 50 [nm] on the exposed portion. Thus, the upper portions of the phosphorus-doped portion 24 and the boron-doped portion 30 are covered by the silicon nitride film 34.

Figure 1I:
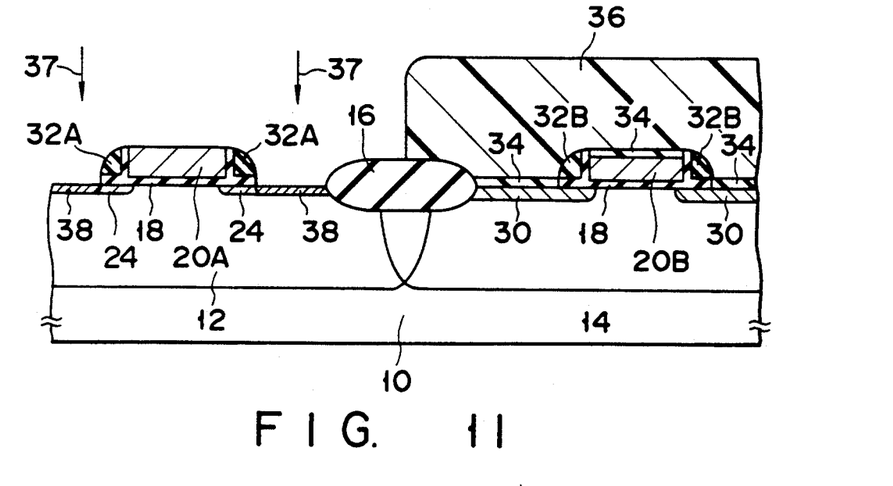

As shown in FIG. 1I, a photoresist is coated on the resultant structure to obtain a photoresist layer. This photoresist layer is patterned by photolithographic etching to obtain a photoresist pattern 36. The photoresist pattern 36 is formed on the region 14 to cover the upper portion of the n-type well region 14. The silicon nitride film 34 is removed from the p-type well region 12. For example, phosphorus ions 37 are doped in the p-type well region 12 at a dose of $5 \times 10^{15}$ [cm$^{-2}$] using the photoresist pattern 36 and the gate electrode 20A as masks. The portion in which the phosphorus ions are doped is represented by reference numeral 38 in FIG. 1I. The impurity implantation for forming the source/drain diffusion layers of a MOSFET of this embodiment is finished by the phosphorus ion doping. In this case, the boron-doped portion 30 is prospectively used as the source/drain diffusion layer of a p-channel MOSFET. Similarly, the phosphorus-doped portion 38 is prospectively used as the source/drain diffusion layer of an n-channel MOSFET. The arsenic doped portion 24 is prospectively used as an LDD region.

Figure 1J:
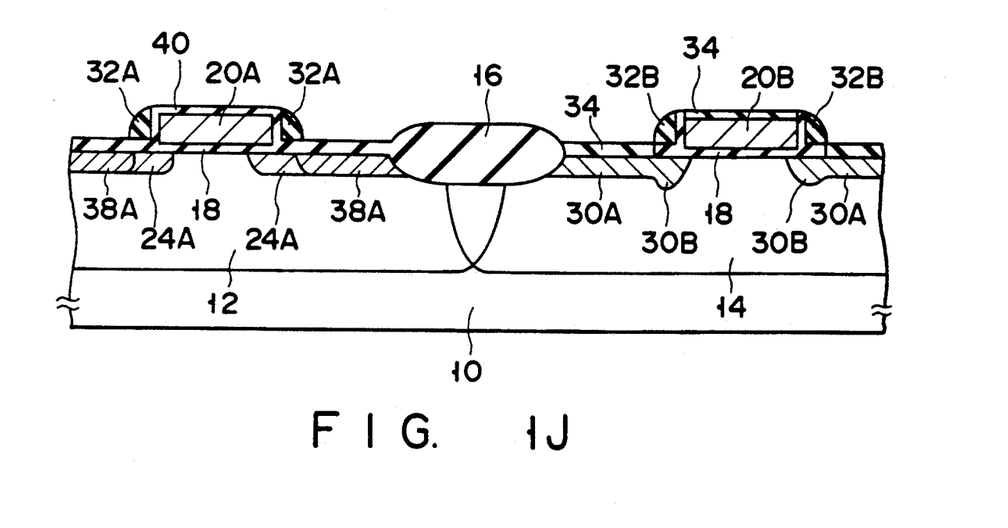

As shown in FIG. 1J, the photoresist pattern 36 is removed from the n-type well region 14. Active annealing for diffusing an impurity in the substrate (the well regions 12 and 14) is performed in an oxygen atmosphere. As a condition for this annealing, an annealing temperature is about 950° C., and an annealing time is about 60 minutes.

At this time, a silicon-exposed portion is oxidized to form an oxide film 40 as described in FIG. 1J. When this annealing is finished, a high-impurity concentration n$^+$-type source/drain diffusion layer 38A and a low-impurity concentration n$^{31}$-type LDD region 24A of the n-channel MOSFET are formed. The diffusion layer 38A contains phosphorus as the donor, and the LDD region 24A contains arsenic as the donor. At the same time, high-impurity concentration p$^-$-type source/drain diffusion layers 30A and 30B of the p-channel MOSFET are formed. The diffusion layers 30A and 30B contain boron as acceptors.

Figure 1K:
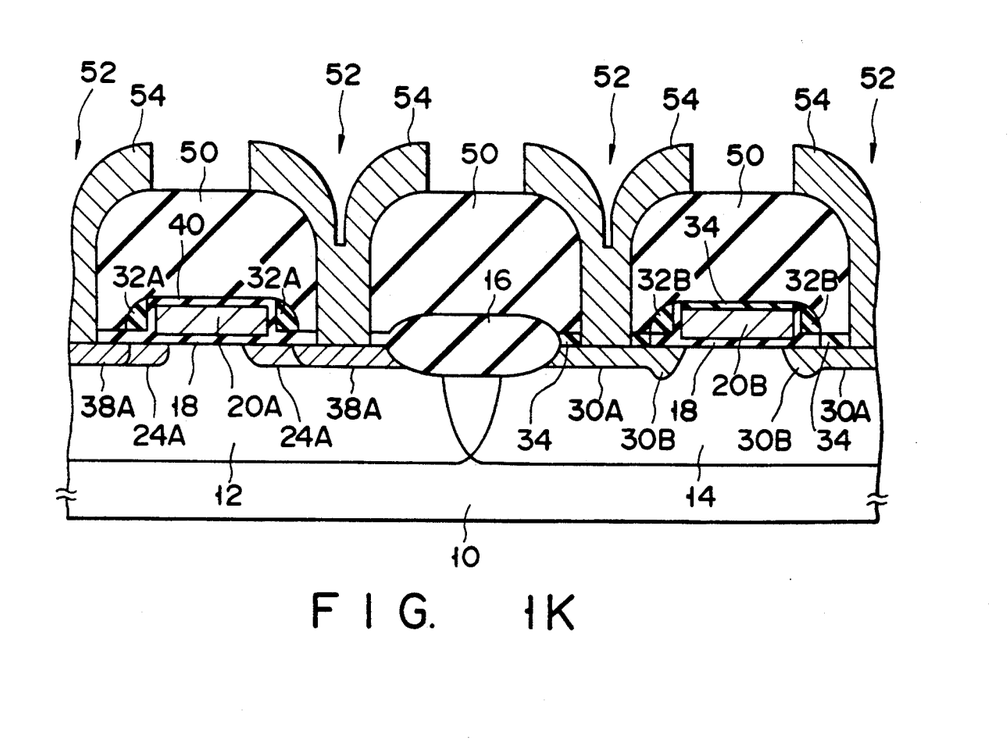

Thereafter, as shown in FIG. 1K, an insulating interlayer 50 is formed on the resultant structure. Contact holes 52 contacting the source/drain diffusion layers 30A and 38A are formed in the insulating interlayer 50. An internal wiring layer 54 electrically connected to the source/drain diffusion layers 30A and 38A through the contact holes 52 is formed on the insulating interlayer 50.

According to the above semiconductor device and the method for manufacturing the same, since the silicon nitride film 34 is formed especially on the upper portion of the p-type source/drain diffusion layer 30A of the p-channel MOSFET, a diffusion rate of boron can be decreased in the region under the nitride layer 34. At the same time, out-diffusion of boron can be suppressed. Therefore, a diffusion layer having small lengths in directions perpendicular and parallel to the substrate surface can be obtained, thereby shallowing the diffusion layer. In addition, since boron ions are not excessively diffused in the diffusion layer, the impurity concentration of the diffusion layer is not decreased, and therefore, the source/drain diffusion layer 30A having a high-impurity concentration can be obtained. The p$^+$-type source/drain diffusion layer 30A can have an impurity within a range of impurity concentration of $10^{19}$ to $10^{20}$ [cm$^{-3}$] on the surface of the substrate. Even when the internal wiring layer 54 is brought into contact with the diffusion layer 30A, its contact resistance can be sufficiently decreased. Furthermore, since the impurity concentration of the p$^+$-type source/drain region 30A is high, its sheet resistance can be sufficiently decreased.

In addition, at the same time, in the source/drain diffusion layer 30B under the side wall 32B, since a diffusion rate of boron is not decreased, the boron is further diffused in the substrate (the well region 14). For this reason, in the diffusion layer 30B, the impurity concentration of the p$^+$-type source/drain diffusion layer is decreased. The impurity concentration of the diffusion layer 30B falls within a range of about $10^{17}$ to $10^{18}$ [cm$^{-3}$].

Since a p-channel MOSFET naturally has an LDD structure, electric concentration immediately below the gate electrode 20B can be relaxed. Therefore, a short-channel effect such as impact ionization multiplication can be prevented, and a highly reliable p-channel MOS- FET having excellent short-channel effect withstanding can be obtained.

A p-channel MOSFET having the LDD structure can prevent threshold variations caused by hole trapping in the gate oxide film 18, although these variations are expected to frequently occur due to a further development of micropatterning. In order to obtain the LDD structure, two impurity doping steps which are performed in the n-channel MOSFET need not be performed, and a single impurity doping step is performed. When a difference between the extension of the diffusion layer immediately below the nitride film 34 and the extension of the side wall 32B, i.e., the diffusion layer immediately below the oxide film is utilized, the LDD structure can be easily obtained without adding another step.

Figure 2:
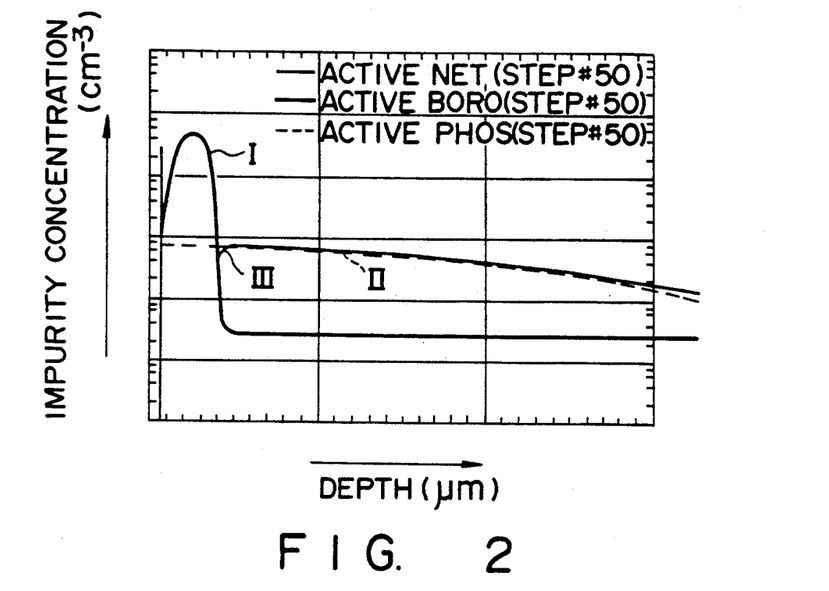
FIG. 2 is a graph showing an impurity profile of the semiconductor device according to the present invention.
Figure 3:
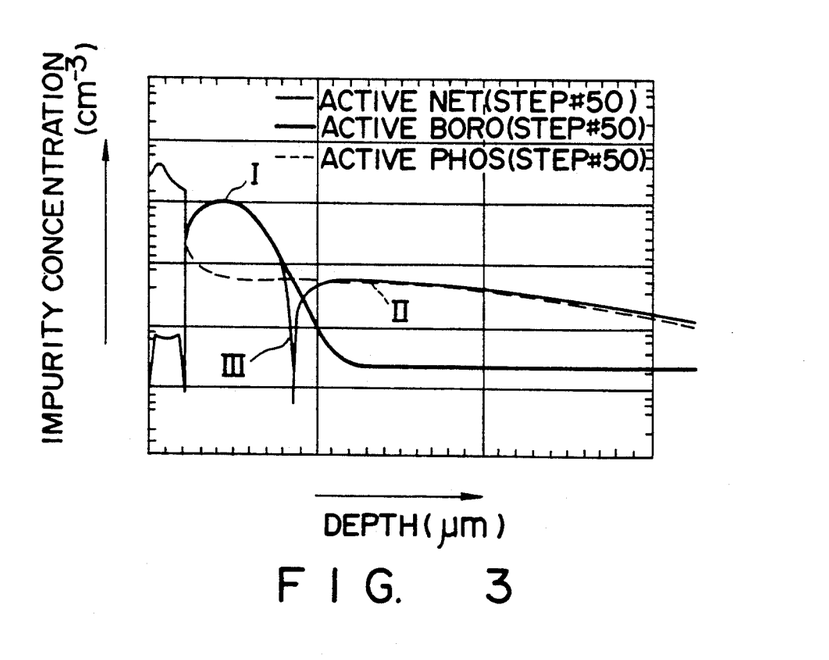
FIG. 3 is a graph showing an impurity profile of a conventional semiconductor device.

FIG. 2 is a graph showing an impurity profile of the p-channel MOSFET having a nitride film on a source/drain diffusion layer described in the first embodiment. FIG. 3 is a graph showing an impurity profile of a p-channel MOSFET having no nitride film on a source/drain diffusion layer.

In FIGS. 2 and 3, lines I illustrate profiles of boron; lines II, profiles of phosphorus; lines III, effective profiles of a p-type source/drain region on a MOSFET.

As shown in FIG. 2, in a MOSFET according to the above embodiment, a shallow portion from the substrate surface contains high-concentration boron (refer to the line I), and the p-type source/drain region can be shallowed (refer to the line III).

In contrast to this, in a conventional MOSFET, as shown in FIG. 3, boron extends in the deep portion of the substrate, the concentration of the boron is decreased (refer to the line I), and a p-type source/drain region is formed in the deep portion of the substrate (refer to the line III).

A CMOS semiconductor device according to the second embodiment of the present invention will be described below.

Figure 4A:
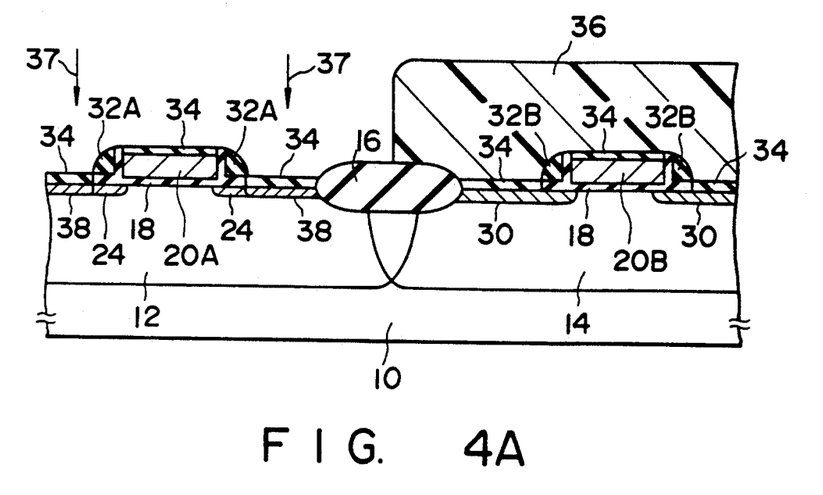
FIGS. 4A and 4B are sectional views showing main steps of manufacturing a CMOS semiconductor device according to the second embodiment of the present invention.
Figure 4B:
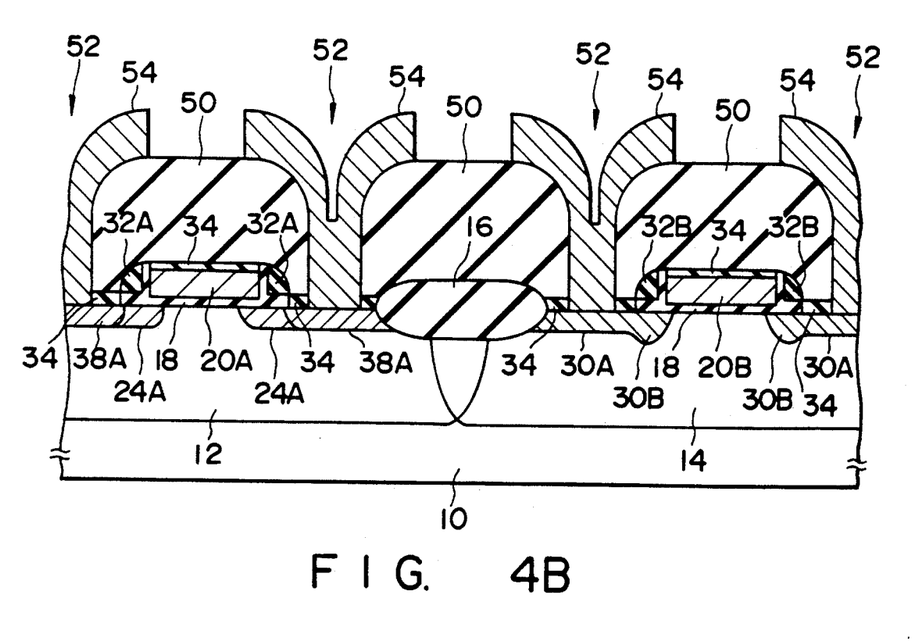

FIGS. 4A and 4B are sectional views showing main manufacturing steps of a CMOS semiconductor device according to the second embodiment.

In a device according to the first embodiment, as shown in FIG. 1J, the silicon nitride film 34 is removed from the source/drain diffusion layer 38A (38) of the n-channel MOSFET. However, in this embodiment, as shown in FIG. 4A, the silicon nitride film 34 is not removed from the portion 38 in which arsenic is doped. As shown in FIG. 4B, the silicon nitride film 34 may remain on the source/drain diffusion layer 38A.

Even in the device according to the second embodiment, since the silicon nitride film 34 is formed on a source/drain diffusion layer 30A of a p-channel MOSFET, the same effect as described in the first embodiment can be obtained.

As described above, according to the present invention, even when a diffusion layer contains an impurity such as boron which exhibits an OED effect, there can be provided a semiconductor device in which the diffusion layer does not expand.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
   a semiconductor body of a first conductivity type having a major surface;
   a source diffusion layer of a second conductivity type formed in the major surface of said semiconductor body;
   a drain diffusion layer of the second conductivity type formed in the major surface of said semiconductor body;
   an insulating layer formed on a channel region defined between said source and drain diffusion layers;
   a gate electrode formed on said insulating layer;
   a side wall insulating layer formed on a side surface of said gate electrode, a portion of said source diffusion layer and a portion of said drain diffusion layer;
   a film formed on respective portions of said source and drain diffusion layers for preventing oxygen enhanced diffusion in said source and drain diffusion layers;
   openings in said film, said openings exposing respective portions of said source and drain diffusion layers; and
   a wiring layer formed on said semiconductor body and contacting said respective exposed portions of said source and drain diffusion layers.
   wherein said source diffusion layer is formed to a greater depth under said side wall insulating layer than under said film, and said drain diffusion layer is formed to a greater depth under said side wall insulating layer than under said film.

2. The semiconductor device according to claim 1, wherein said source diffusion layer and said drain diffusion layer each contain an impurity whose diffusivity within said semiconductor body is affected by the presence of oxygen.

3. The semiconductor device according to claim 1, wherein said film is a nitride film.

4. The semiconductor device according to claim 2, wherein said impurity is boron.

5. The semiconductor device according to claim 1, wherein said side wall insulating layer is an oxide layer.

6. A semiconductor device comprising:
   a semiconductor body of a first conductivity type having a major surface;
   a semiconductor region of a second conductivity type formed in the major surface of said semiconductor body;
   a source diffusion layer of the second conductivity type formed in the major surface of said semiconductor body;
   a drain diffusion layer of the second conductivity type formed in the major surface of said semiconductor body;
   a source diffusion layer of the first conductivity type formed in a surface of said semiconductor region;
   a drain diffusion layer of the first conductivity type formed in the surface of said semiconductor region;
   an insulating layer formed on the channel regions respectively defined between said source and drain diffusion layers of the second conductivity type and between said source and drain diffusion layers of the first conductivity type;
   first and second gate electrodes respectively formed on said insulating layer between said source and drain diffusion layers of the second conductivity type and said source and drain diffusion layers of the first conductivity type;

a first side wall insulating layer formed on a side surface of said second gate electrode, a portion of said source diffusion layer of the first conductivity type and a portion of said drain diffusion layer of the first conductivity type;

a film formed on respective portions of said source and drain diffusion layers of the first conductivity type for preventing oxygen enhanced diffusion in said source and drain diffusion layers of the first conductivity type;

openings in said film, said openings exposing respective portions of said source and drain diffusion layers of the first conductivity type; and a wiring layer formed on said semiconductor body and contacting said exposed portions of said source and drain diffusion layers of the first conductivity type;

wherein said source diffusion layer of the first conductivity type is formed to a greater depth under said first side wall insulating layer than under said film, and said drain diffusion layer of the first conductivity type is formed to a greater depth under said first side wall insulating layer than under said film.

7. The semiconductor device according to claim 6, wherein said source diffusion layer of the first conductivity type and said drain diffusion layer of the first conductivity type each contain an impurity whose diffusivity within said semiconductor body is affected by the presence of oxygen.

8. The semiconductor device according to claim 6, wherein said film is a nitride film.

9. The semiconductor device according to claim 7, wherein said impurity is boron.

10. The semiconductor device according to claim 6, wherein said first side wall insulating layer is an oxide layer.

11. The semiconductor device according to claim 6, wherein said film is formed on respective portions of said source and drain diffusion layers of the second conductivity type for preventing oxygen-enhanced-diffusion in said source and drain diffusion layers of the second conductivity type.

12. The semiconductor device according to claim 6, further comprising a second side wall insulating layer formed on a side surface of said first gate electrode, a portion of said source diffusion layer of the second conductivity type and a portion of said drain diffusion layer of the second conductivity type.

13. The semiconductor device according to claim 12, wherein said second side wall insulating layer is an oxide layer.

14. A semiconductor device according to claim 1, wherein said source diffusion layer has a lower impurity concentration under said side wall insulating layer than under said film, and said drain diffusion layer has a lower impurity concentration under said side wall insulating layer than under said film.

15. A semiconductor device according to claim 1, wherein said first conductivity type is n-type and said second conductivity type is p-type.

16. A semiconductor device according to claim 6, wherein said source diffusion layer of the first conductivity type has a lower impurity concentration under said first side wall insulating layer than under said film, and said drain diffusion of the first conductivity type layer has a lower impurity concentration under said first side wall insulating layer than under said film.

17. A semiconductor device according to claim 6, wherein said first conductivity type is p-type and said second conductivity type is n-type.

18. A semiconductor device according to claim 11, wherein said source diffusion layer of the second conductivity type has a lower impurity concentration under said second side wall insulating layer than under said film, and said drain diffusion layer of the second conductivity type layer has a lower impurity concentration under said second side wall insulating layer than under said film.

19. A semiconductor device according to claim 11, wherein said film is a nitride film.

20. A semiconductor device comprising:

a semiconductor body of a first conductivity type having a major surface;

a source diffusion layer of a second conductivity type formed in the major surface of said semiconductor body, said source diffusion layer having first and second source diffusion portions;

a drain diffusion layer of the second conductivity type formed in the major surface of said semiconductor body, said drain diffusion layer having first and second drain diffusion portions;

a gate electrode insulatively spaced from a channel region between said source and drain diffusion layers;

an insulating layer formed on a side wall of said gate electrode and on portions of said major surface above said first source diffusion portion and said first drain diffusion portion;

a film formed on said major surface above said second source diffusion portion and said second drain diffusion portion for preventing oxygen enhanced diffusion in said source and drain diffusion layers;

openings in said film exposing said second source diffusion portion and said second drain diffusion portion; and a wiring layer contacting said exposed second source diffusion portion and second drain diffusion portion wherein said first source diffusion portion is formed to a greater depth than said second source diffusion portion, and said first drain diffusion portion is formed to a greater depth than said second drain diffusion portion.

* * * * *